United States Patent
Ho et al.

(10) Patent No.: US 10,368,430 B2
(45) Date of Patent: Jul. 30, 2019

(54) HEAT DISSIPATION DEVICE

(71) Applicant: COOLER MASTER CO., LTD., New Taipei (TW)

(72) Inventors: Chun-Ching Ho, New Taipei (TW); Hsin-Hung Chen, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 9 days.

(21) Appl. No.: 15/908,783

(22) Filed: Feb. 28, 2018

(65) Prior Publication Data

US 2018/0352645 A1 Dec. 6, 2018

(30) Foreign Application Priority Data

Jun. 6, 2017 (CN) .......................... 2017 1 0418882

(51) Int. Cl.
| | | |
|---|---|---|
| *H05K 1/02* | (2006.01) | |
| *G06F 1/20* | (2006.01) | |
| *F28D 9/00* | (2006.01) | |
| *H05K 7/20* | (2006.01) | |
| *F28D 15/02* | (2006.01) | |
| *H01L 23/427* | (2006.01) | |
| *H01L 23/40* | (2006.01) | |

(52) U.S. Cl.
CPC ......... *H05K 1/0203* (2013.01); *F28D 9/0075* (2013.01); *F28D 15/0233* (2013.01); *F28D 15/0275* (2013.01); *G06F 1/20* (2013.01); *H01L 23/427* (2013.01); *H05K 7/20336* (2013.01); *H05K 7/20509* (2013.01); *H01L 23/4093* (2013.01); *H05K 7/2039* (2013.01); *H05K 7/20709* (2013.01)

(58) Field of Classification Search
CPC ........... H05K 7/20163; H05K 7/20154; H05K 7/20336; H05K 7/20509; H05K 7/2039; H05K 7/20709; F28D 9/0075; F28D 15/0275; H01L 23/427; H01L 23/4093; G06F 1/20
See application file for complete search history.

(56) References Cited

U.S. PATENT DOCUMENTS 6,711,021 B1 *  3/2004  Morris ................... H05K 1/141
                                              165/104.33
7,289,331 B2 * 10/2007  Foster, Sr. ............. G06F 1/184
                                              165/80.3

(Continued)

*Primary Examiner* — David M Sinclair
*Assistant Examiner* — Robert D Brown
(74) *Attorney, Agent, or Firm* — Maschoff Brennan (57) ABSTRACT

A heat dissipation device includes a heat dissipation piece, heat conduction plates, a rod piece and a switch. The heat conduction plates are connected to the heat dissipation piece and spaced apart from and arranged parallel to each other so as to define accommodating spaces. Each heat conduction plate has a free end away from the heat dissipation piece, and the free end has a through hole. The rod piece has a first end and a second end opposite to each other, the rod piece penetrates through the through holes, and the second end has a limitation portion. The switch has a cam portion pivoted to the first end. When the switch is pivoted with respect to the heat conduction plates, the cam portion drives the rod piece to move among the through holes, making the limitation portion to press against or be separated from the heat conduction plates.

12 Claims, 8 Drawing Sheets

(56) References Cited

U.S. PATENT DOCUMENTS

| | | | | |
|---|---|---|---|---|
| 8,570,744 | B2* | 10/2013 | Rau | G06F 1/20 |
| | | | | 361/679.52 |
| 9,068,784 | B2* | 6/2015 | Cox | H01L 23/367 |
| 9,155,194 | B1* | 10/2015 | Sullivan | H05K 1/116 |
| 9,786,578 | B2* | 10/2017 | Cox | H01L 23/427 |
| 2006/0221578 | A1* | 10/2006 | Foster, Sr. | G06F 1/184 |
| | | | | 361/721 |
| 2006/0238992 | A1* | 10/2006 | Chen | G06F 1/186 |
| | | | | 361/801 |
| 2011/0235271 | A1* | 9/2011 | Budai | G06F 1/185 |
| | | | | 361/692 |
| 2012/0020004 | A1* | 1/2012 | Rau | G06F 1/20 |
| | | | | 361/679.31 |
| 2012/0026670 | A1* | 2/2012 | Rau | G06F 1/20 |
| | | | | 361/679.31 |
| 2012/0113586 | A1* | 5/2012 | Rau | G06F 1/20 |
| | | | | 361/679.47 |
| 2013/0153193 | A1* | 6/2013 | Li | H01L 23/367 |
| | | | | 165/185 |
| 2017/0184168 | A1* | 6/2017 | Wen | F16D 55/228 |
| 2017/0250045 | A1* | 8/2017 | Bayer | H01H 1/0015 |
| 2017/0312871 | A1* | 11/2017 | Lin | B23P 15/26 |
| 2018/0146575 | A1* | 5/2018 | Ho | G06F 1/20 |

* cited by examiner

HEAT DISSIPATION DEVICE

CROSS-REFERENCE TO RELATED APPLICATIONS

This non-provisional application claims priority under 35 U.S.C. § 119(a) on Patent Application No(s). 201710418882.7 filed in China on Jun. 6, 2017, the entire contents of which are hereby incorporated by reference.

TECHNICAL FIELD

The disclosure relates to a heat dissipation device, more particularly to a heat dissipation device capable of being installed on memory modules on a motherboard.

BACKGROUND

When a computer is in operation, the temperature of its internal electrical components and memory modules would raise, so the computer requires a heat dissipation device to cool the electrical components or the memory modules in order to keep them operating normally. For example, the computer has fans near a motherboard, so heat generated by the motherboard can be removed by the fans, thereby decreasing the temperature of the motherboard.

To a server which can process a great amount of data, its motherboard is installed with many memory modules, that are arranged parallel to each other, in order to meet the operation requirement. However, there is no device yet specifically for removing heat generated by the memory modules.

SUMMARY

The present disclosure provides a heat dissipation device which is capable of solving the aforementioned problems.

One embodiment of the disclosure provides a heat dissipation device including a heat dissipation piece, a plurality of heat conduction plates, a rod piece and a switch. The plurality of heat conduction plates are connected to the heat dissipation piece and spaced apart from and arranged parallel to each other, such that the heat dissipation piece and the plurality of heat conduction plates together form a comb shape so as to define a plurality of accommodating spaces. Each of the plurality of the heat conduction plates has a free end away from the heat dissipation piece, and the free end has a through hole. The rod piece has a first end and a second end opposite to each other, the rod piece penetrates through the through holes of the plurality of heat conduction plates, and the second end has a limitation portion. The switch has a cam portion which is pivoted to the first end of the rod piece. When the switch is pivoted with respect to the plurality of heat conduction plates, the cam portion drives the rod piece to move among the through holes, making the limitation portion of the rod piece to press against or be separated from the plurality of heat conduction plates.

One embodiment of the disclosure provides a heat dissipation device including a heat dissipation piece, a plurality of heat conduction plates, a rod piece and a switch. The plurality of heat conduction plates are connected to the heat dissipation piece and configured to define a plurality of accommodating spaces configured to accommodate a plurality of memory modules, and each of the plurality heat conduction plates has a through hole. The rod piece has a first end and a second end, the rod piece penetrates through the through holes of the plurality of heat conduction plates, and the second end has a limitation portion. The switch has a cam portion which is pivoted to the rod piece, wherein the rod piece is movable among the through holes by being driven by the cam portion so as to make the limitation portion to presses against or be separated from the plurality of heat conduction plates.

The aforementioned heat dissipation devices are adapted to be installed on the memory modules on a motherboard which are arranged parallel to each other, and the accommodating spaces between the heat conduction plates are adapted to accommodate the memory modules.

According to the heat dissipation device as discussed in above, the heat conduction plates have the accommodating spaces for accommodating the memory modules, and the cam portion of the switch is able to press against or be separated from the heat conduction plates to move the rod piece among the through holes of the heat conduction plates when the switch is pivoted with respect to the heat conduction plates. When the limitation portion of the rod piece presses against the heat conduction plates, the heat conduction plate and the memory modules are maintained in a tight contact manner. As such, heat generated by the memory modules can be conducted to the heat dissipation piece through the heat conduction plates, thereby reducing the rate of temperature rise of the memory modules.

In addition, when the limitation portion of the rod piece is separated from the heat conduction plates, the heat conduction plates are not in tight contact with the memory modules, such that the memory modules are allowed to be taken out from the accommodating spaces.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known main structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure. Furthermore, in order to simplify the drawings, some conventional structures and components are drawn in a simplified manner to keep the drawings clean.

Figure 1:
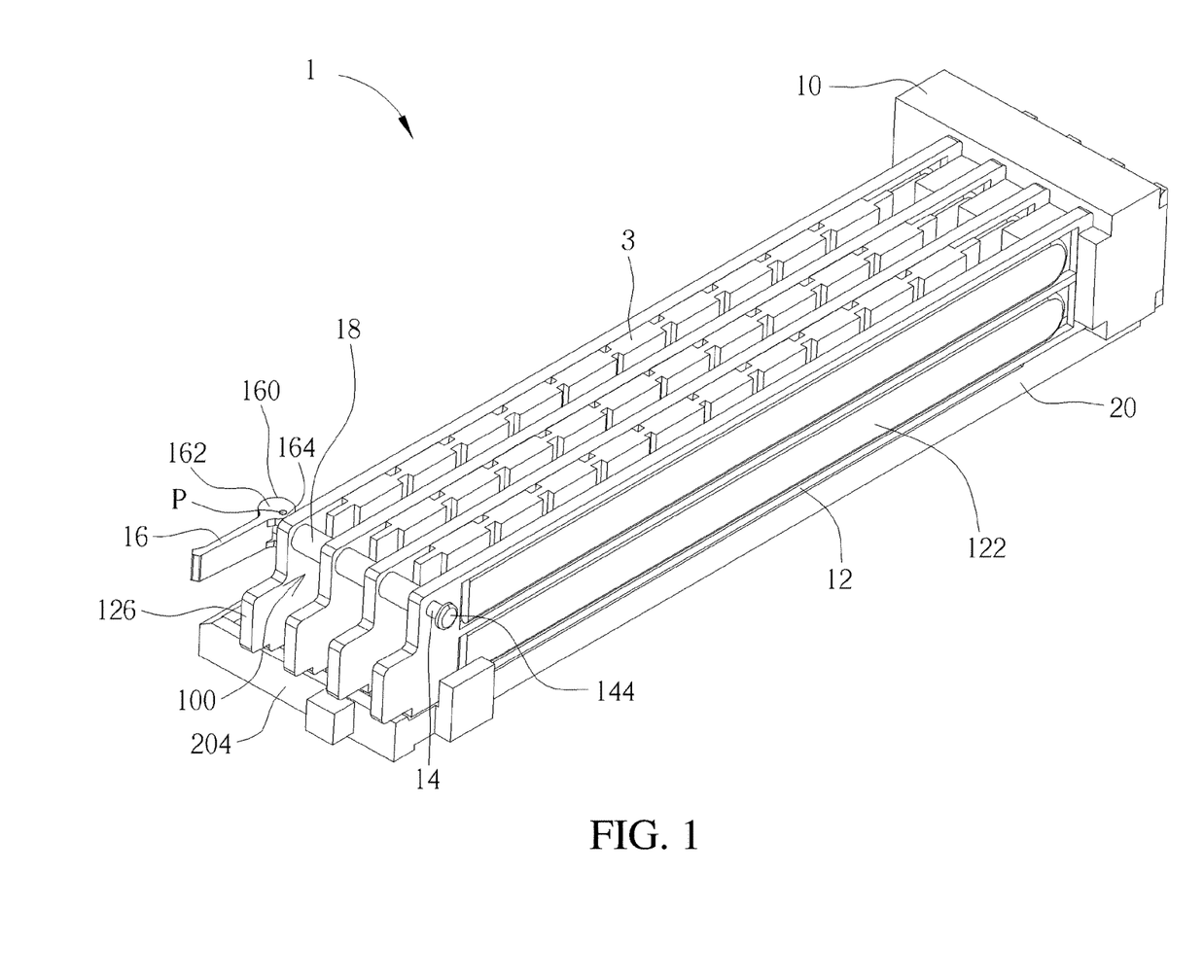
FIG. 1 is a perspective view of a heat dissipation device according to one embodiment of the disclosure, wherein it a switch is in an on-state.
Figure 2:
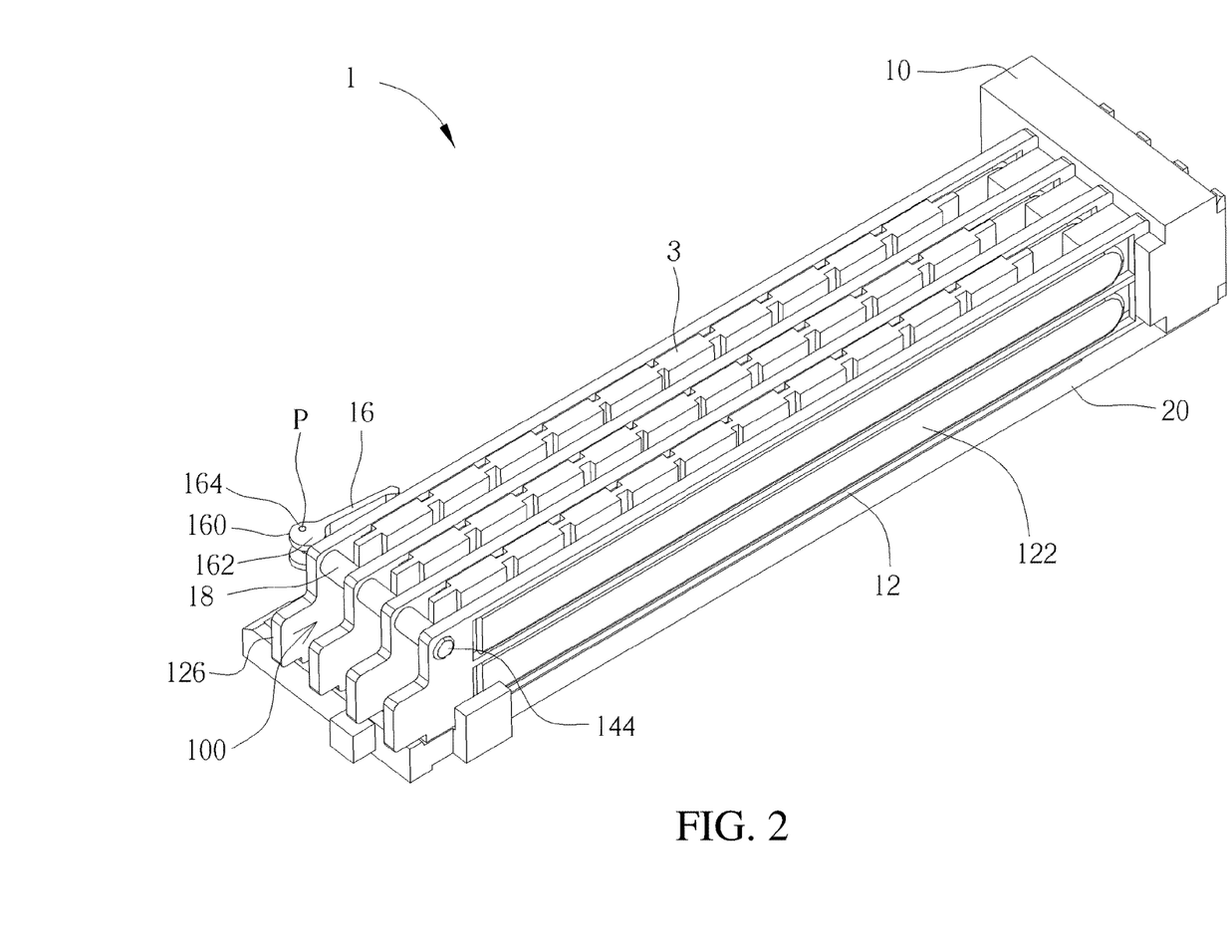
FIG. 2 is a perspective view of the heat dissipation device in FIG. 1 when the switch is switched from the on-state to an off-state.
Figure 3:
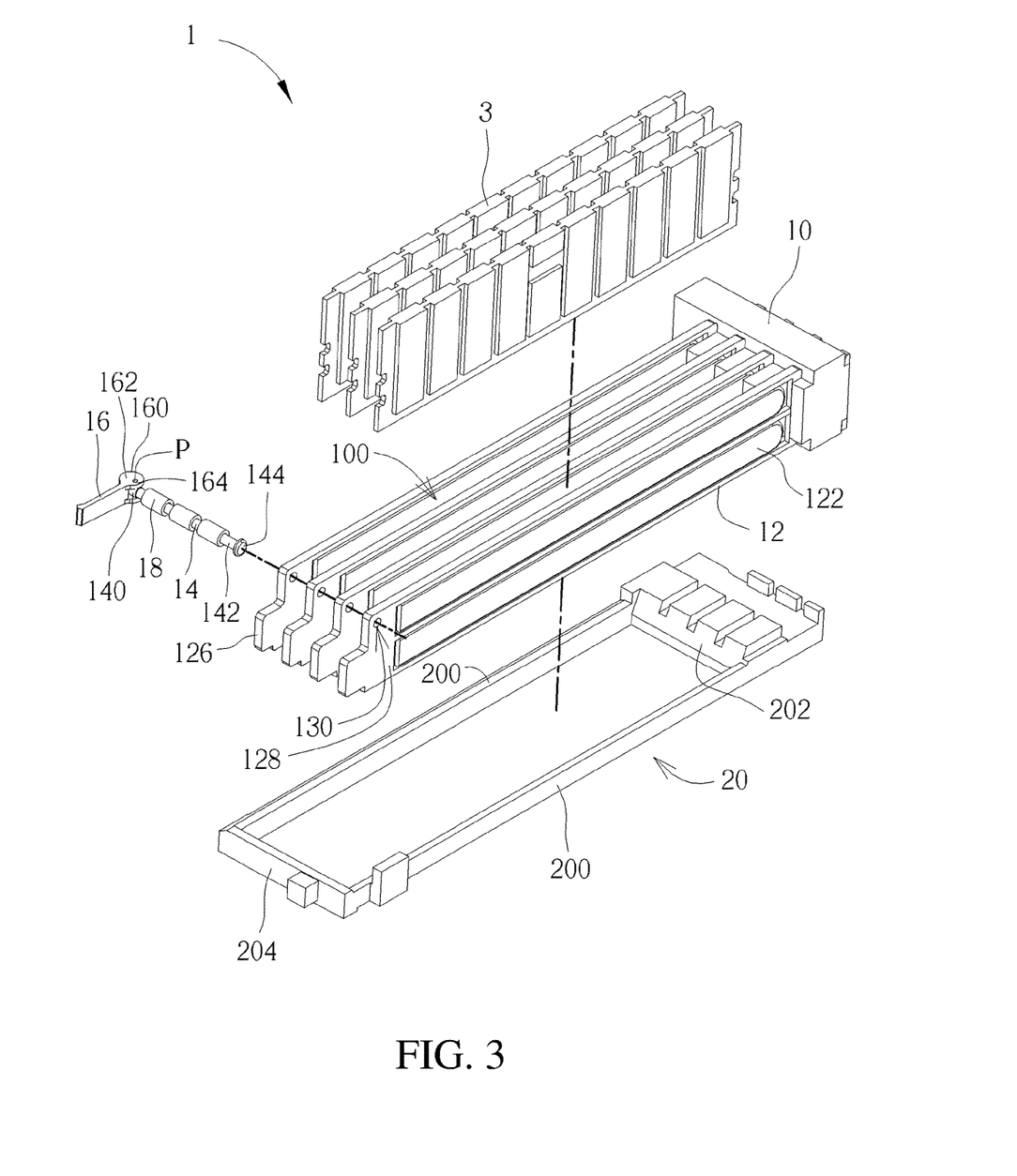
FIG. 3 is an exploded view of the heat dissipation device in FIG. 1.
Figure 4:
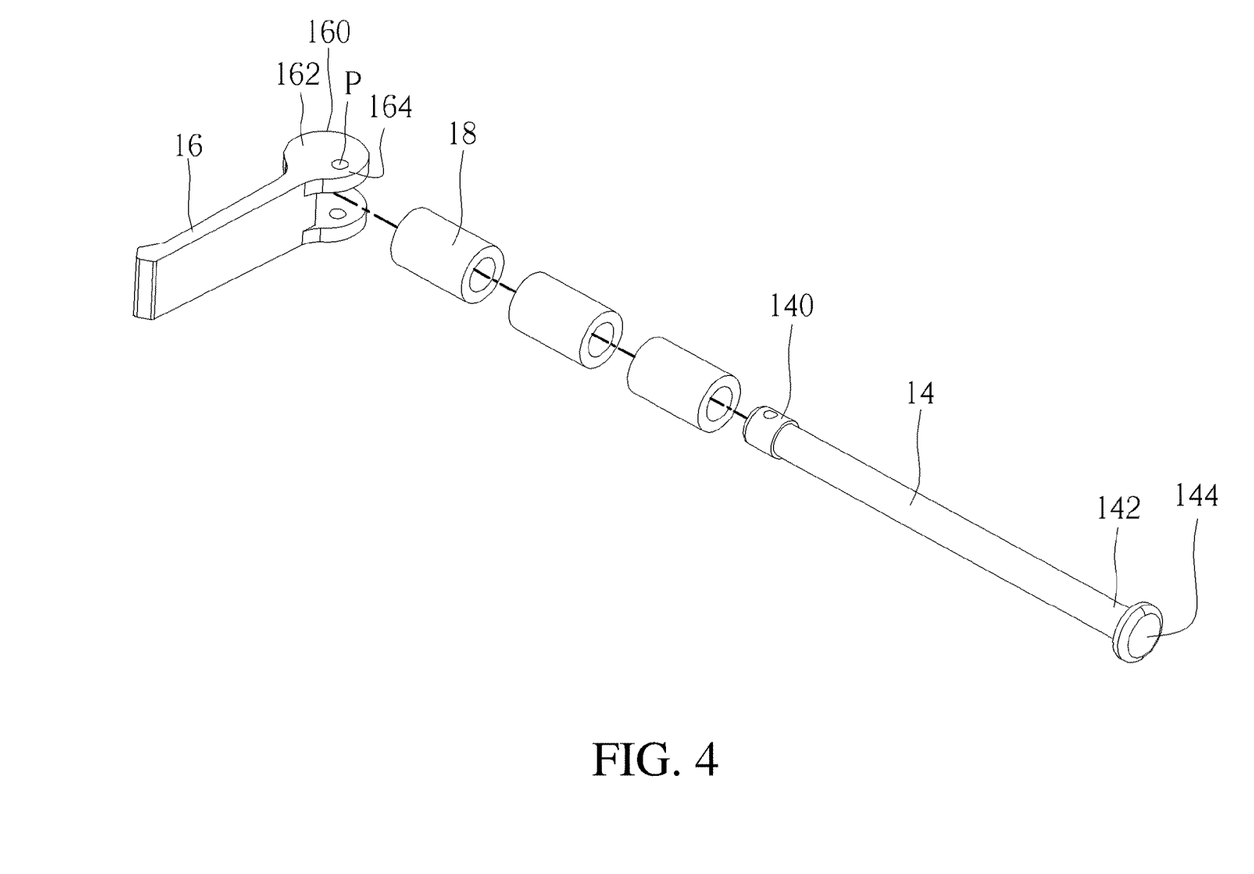
FIG. 4 is an explode view of a rod piece, the switch and a sleeve in FIG. 3.
Figure 5:
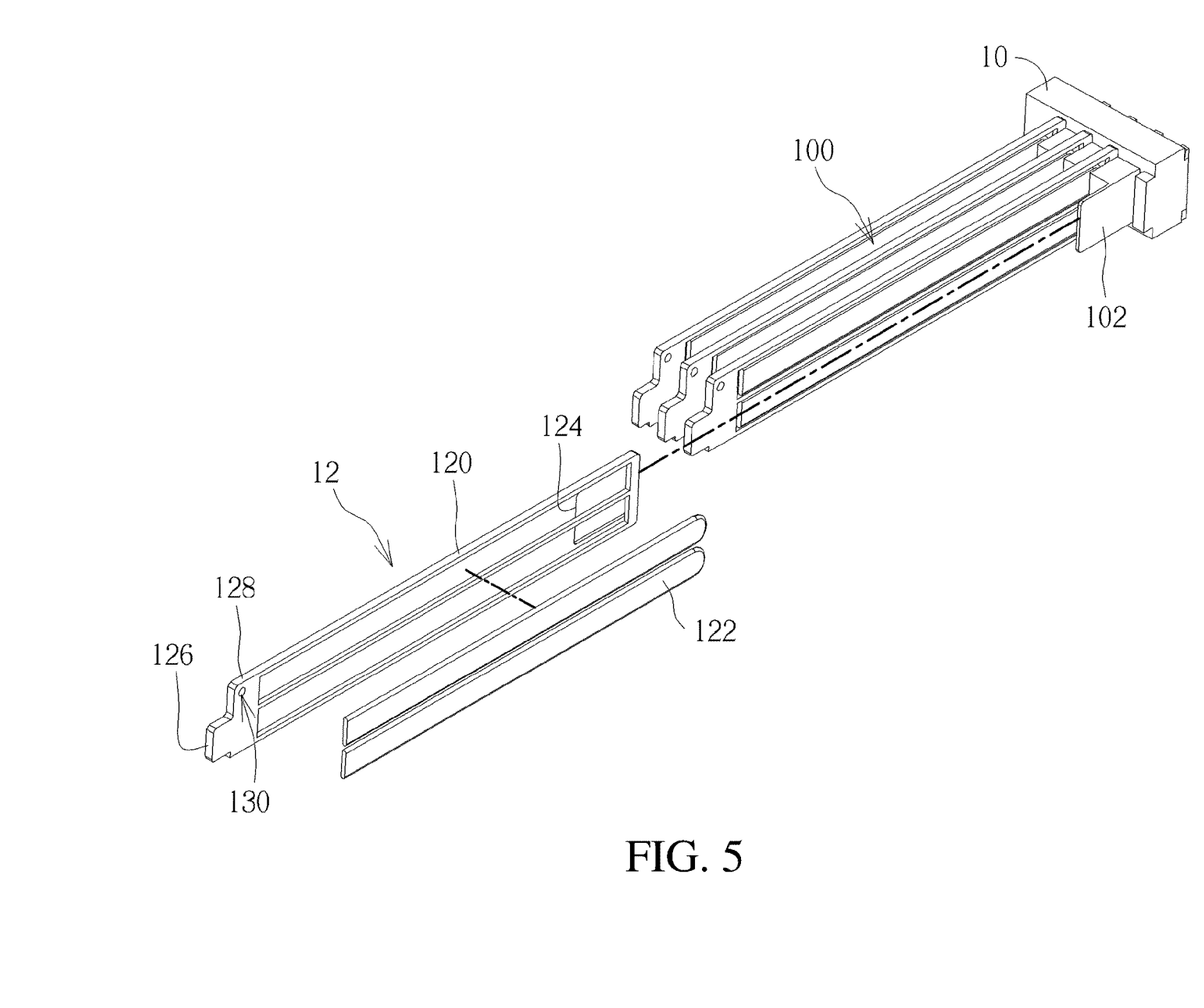
FIG. 5 is an explode view of a heat dissipation piece, heat conduction plates and heat pipes in FIG. 3.

Please refer to FIGS. 1 to 5: FIG. 1 is a perspective view of a heat dissipation device 1 according to one embodiment of the disclosure, and FIG. 1 shows that the heat dissipation device 1 has a switch 16 in an on-state; FIG. 2 is a perspective view of the heat dissipation device 1 in FIG. 1 when the switch 16 is switched from the on-state to an off-state; FIG. 3 is an exploded view of the heat dissipation device 1 in FIG. 1; FIG. 4 is an explode view of a rod piece 14, the switch 16 and a sleeve 18 in FIG. 3; and FIG. 5 is an explode view of a heat dissipation piece 10, a plurality of heat conduction plates 12 and a plurality of heat pipes 122 in FIG. 3.

The heat dissipation device 1 is adapted for memory modules 3 on a motherboard (not shown in figures) which are arranged parallel to each other, but the present disclosure is not limited thereto. In this embodiment, the quantity of the memory modules 3 is three, but the present disclosure is not limited thereto. As shown in FIGS. 1-5, the heat dissipation device 1 includes the heat dissipation piece 10, the heat conduction plates 12, the rod piece 14, the switch 16, at least one sleeve 18 and a bottom frame 20.

The bottom frame 20 is configured to surround the memory modules 3. The bottom frame 20 has two first sides 200, a second side 202 and a third side 204. The first sides 200 are spaced apart from each other and extend in a length direction of the memory modules 3, and the second side 202 and the third side 204 are respectively connected to two opposite ends of the first sides 200.

The heat conduction plates 12 are connected to the heat dissipation piece 10 and spaced apart from each other. In this embodiment, the quantity of the heat conduction plates 12 is four, but the present disclosure is not limited thereto. In some other embodiments, the quantity of the heat conduction plates 12 may be two or larger than two. The heat conduction plate 12 extend in the length direction of the memory modules 3 from the heat dissipation piece 10 toward the third side 204 of the bottom frame 20, such that the heat conduction plates 12 and the heat dissipation piece 10 together form a comb shape so as to define a plurality of accommodating spaces 100 for accommodating the memory modules 3. The heat dissipation piece 10 is connected to the second side 202 of the bottom frame 20, and the bottom frame 20 is located under the heat conduction plate 12.

As shown in FIG. 5, in this embodiment, the heat dissipation piece 10 has four insertion portions 102 which extend toward the third side 204 of the bottom frame 20 and are spaced apart from each other (FIG. 5 only shows one of the insertion portions 102), and each of the heat conduction plates 12 has a plate body 120, at least one heat pipe 122 embedded into the plate body 120, and a slot 124 formed on the plate body 120, but the present disclosure is not limited thereto. In this embodiment, in each heat conduction plate 12, there are two heat pipes 122 embedded into the plate body 120, but the present disclosure is not limited thereto. Any one of the insertion portions 102 is able to be inserted into the slot 124 of the heat conduction plate 12. In other word, any one of the heat conduction plates 12 can be fixed to any one of the insertion portions 102 via the slot 124 thereof. In this embodiment, the plate body 120 is substantially in, for example, a rectangular shape, and has a protruding portion 126 which extends toward the third side 204 of the bottom frame 20 (as shown in FIG. 1), but the present disclosure is not limited thereto.

As shown in FIG. 3, each heat conduction plate 12 has a free end 128 which is away from the heat dissipation piece, and the free end 128 has a through hole 130. The rod piece 14 has a first end 140 and a second end 142 opposite to each other. The rod piece 14 penetrates through the through holes 130 of the heat conduction plates 12. The second end 124 of the rod piece 14 has a limitation portion 144. The sleeves 18 are sleeved on the rod piece 14 and are respectively located in the gaps between the heat conduction plates 12. In this embodiment, the quantity of the sleeves 18 is three, but the present disclosure is not limited thereto. In some other embodiments, the heat dissipation device may have only one or more than one sleeves 18. For example, in a case that the quantity of the heat conduction plates 12 is two, it only requires one sleeve 18 sleeved on the rod piece 14, and the sleeve 18 is located between the two heat conduction plates 12. The switch 16 has a cam portion 160, and the cam portion 160 is pivoted to a first end 140 of the rod piece 14. Thus, the switch 16 able to be pivoted to an on-state (as shown in FIG. 1) or an off-state (as shown in FIG. 2) with respect to the heat conduction plates 12.

As shown in FIGS. 1-2, when the switch 16 is pivoted with respect to the heat conduction plates 12, the rod piece 14 would be moved by the cam portion 160 of the switch 16 so as to move among the through holes 130 of the heat conduction plates 12 (as shown in FIG. 3), enabling the limitation portion 144 of the rod piece 14 to press against the heat conduction plates 12 (as shown in FIG. 2) or to be separated from the heat conduction plates 12 (as shown in FIG. 1). In this embodiment, the cam portion 160 of the switch 16 has a long axis portion 162 and a short axis portion 164 with respect to a pivot point P thereof.

As shown in FIG. 2, when the switch 16 is in the off-state, the long axis portion 162 of the cam portion 160 faces a side of the heat conduction plates 12, such that the limitation portion 144 of the rod piece 14 presses against the other side of the heat conduction plates 12. At this moment, the heat conduction plates 12 and the memory modules 3 therebetween are maintained in a tight contact manner. Therefore, heat generated by the memory modules 3 can be conducted to the heat pipes 122 on the heat conduction plates 12, which helps to reduce the rate of temperature rise of the memory modules 3.

As shown in FIG. 1, when the switch 16 is in the on-state, the short axis portion 164 of the cam portion 160 faces the side of the heat conduction plate 12, such that the limitation portion 144 of the rod piece 14 is separated from the other side of the heat conduction plates 12. At this moment, the heat conduction plates 12 are not in tight contact with the memory modules 3, and the heat conduction plates 12 can be moved away from each other, allowing the memory modules 3 to be taken out from the accommodating spaces 100.

Figure 6:
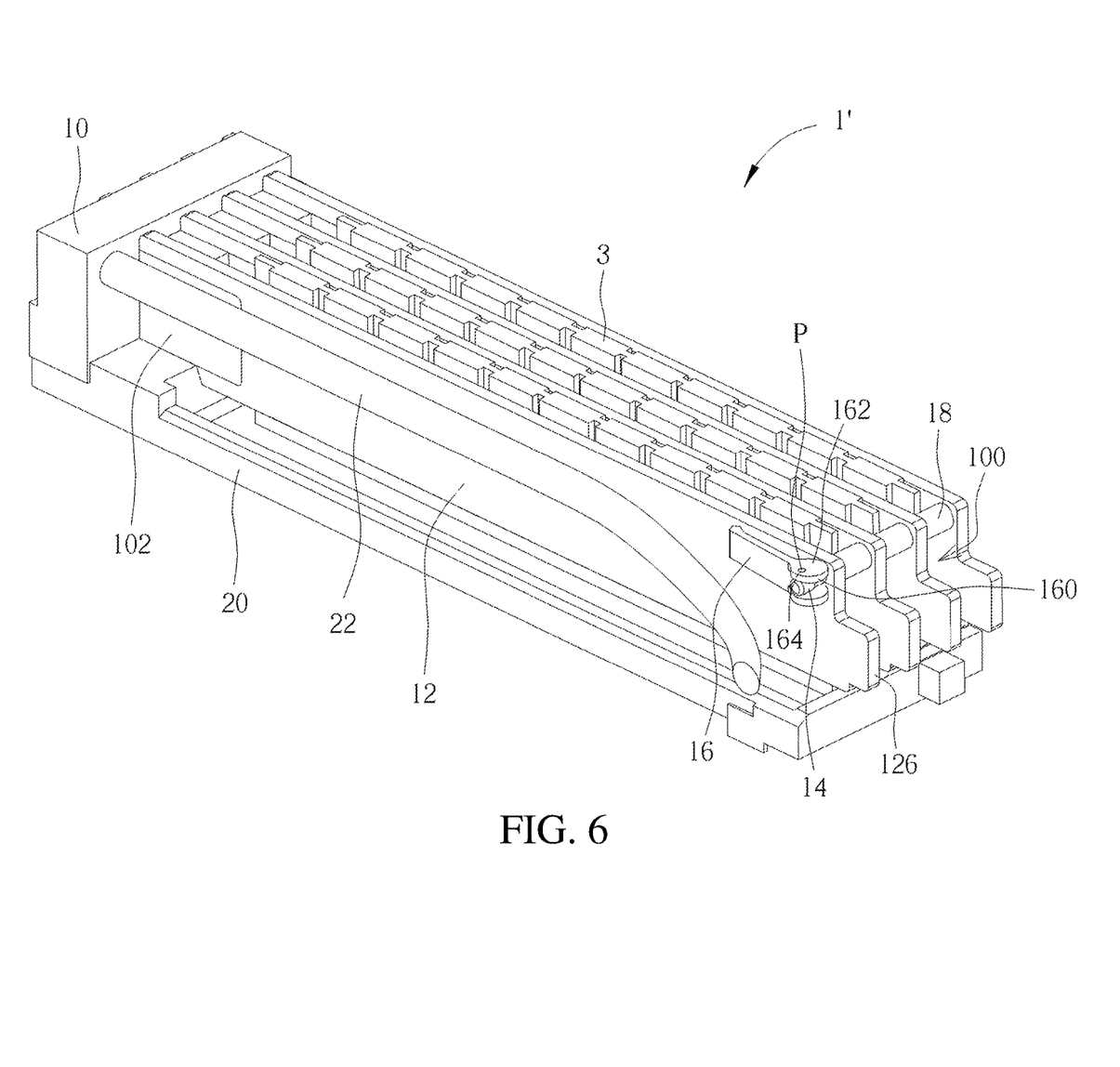
FIG. 6 is a perspective view of a heat dissipation device according to another embodiment of the disclosure.

Please refer to FIG. 6, FIG. 6 is a perspective view of a heat dissipation device 1' according to another embodiment of the disclosure. The difference between the heat dissipation device 1' and the heat dissipation device 1 is that the heat dissipation device 1' further includes a flow tube 22 connected to the heat dissipation piece 10 for the flow of working fluid. In this embodiment, the flow tube 22 is fixed to the heat dissipation piece 10 and is connected to a fluid channel (not shown in figures) within the heat dissipation piece 10, such that the working fluid can be guided into the fluid channel through the flow tube 22 and then discharged from an outlet (not shown in figures) of the fluid channel, thereby enhancing heat exchange. Accordingly, heat generated by the memory modules 3 can be conducted to the heat dissipation piece 10 through the heat conduction plates 12, and then be transferred away from the heat dissipation piece 10 by the working fluid flowing through the fluid channel in the heat dissipation piece 10, thereby removing the heat. The aforementioned working fluid is, for example, a coolant, water or refrigerant.

Figure 7:
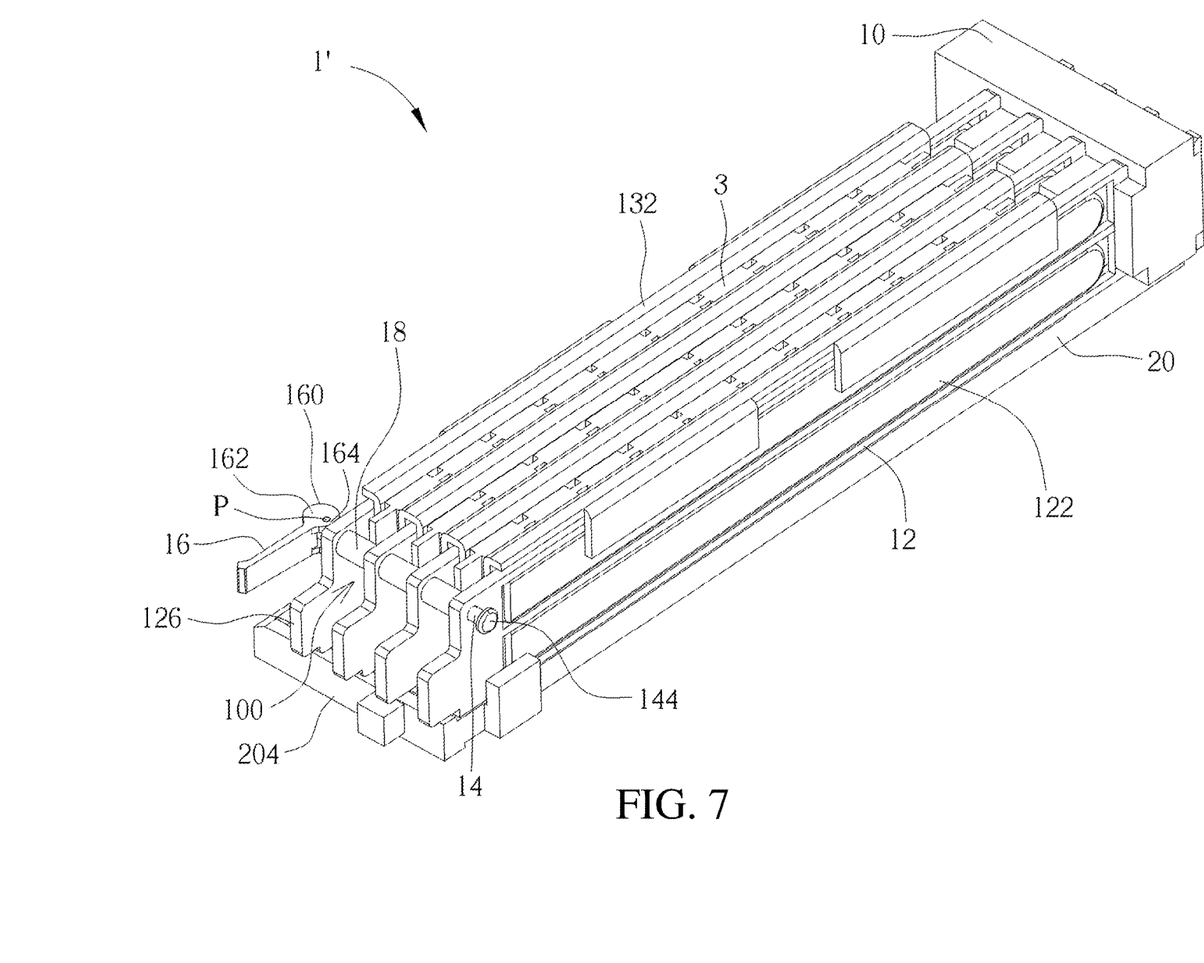
FIG. 7 is a perspective view of a heat dissipation device according to still another embodiment of the disclosure.
Figure 8:
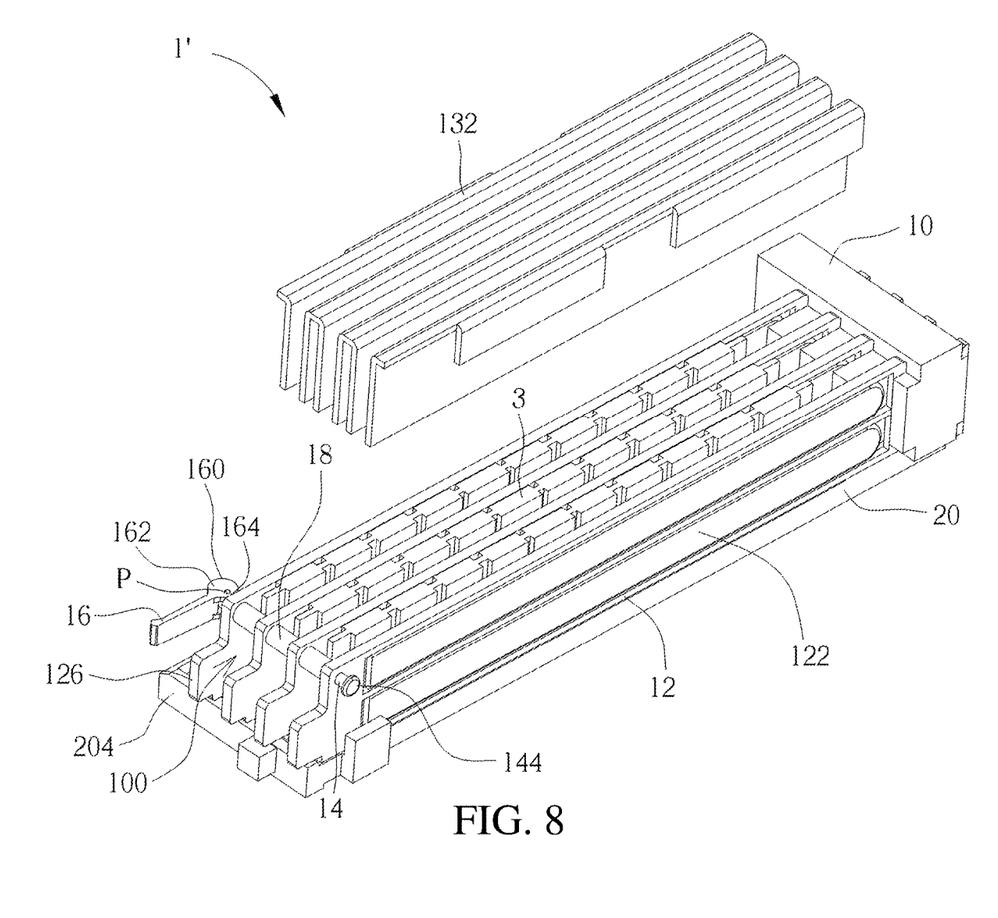
FIG. 8 is an exploded view of the heat dissipation device in FIG. 7.

Please refer to FIGS. 7-8: FIG. 7 is a perspective view of a heat dissipation device 1" according to still another embodiment of the disclosure; and FIG. 8 is an exploded view of the heat dissipation device 1" in FIG. 7. The difference between the heat dissipation device 1" and the heat dissipation device 1 is that each heat conduction plate 12 of the heat dissipation device 1" is disposed with a thermal pad 132. In this embodiment, the thermal pads 132 are configured to contact the adjacent memory modules 3. When the limitation portion 144 of the rod piece 14 presses against the heat conduction plates 12, the thermal pads 132 are pressed by the heat conduction plates 12 and the memory modules 3, such that the heat conduction plates 12 and the memory modules 3 are maintained in a tight contact manner. Therefore, heat generated by the memory modules 3 can be conducted to the heat pipes 122 and the thermal pads 132, which helps to reduce the rate of temperature rise of the memory modules 3.

According to the heat dissipation device as discussed in above, the heat conduction plates have the accommodating spaces for accommodating the memory modules, and the cam portion of the switch is able to press against or be separated from the heat conduction plates to move the rod piece among the through holes of the heat conduction plates when the switch is pivoted with respect to the heat conduction plates. When the limitation portion of the rod piece presses against the heat conduction plates, the heat conduction plate and the memory modules are maintained in a tight contact manner. As such, heat generated by the memory modules can be conducted to the heat dissipation piece through the heat conduction plates, thereby reducing the rate of temperature rise of the memory modules.

In addition, when the limitation portion of the rod piece is separated from the heat conduction plates, the heat conduction plates are not in tight contact with the memory modules, such that the memory modules are allowed to be taken out from the accommodating spaces.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A heat dissipation device, comprising:
   a heat dissipation piece;
   a plurality of heat conduction plates, the plurality of heat conduction plates connected to the heat dissipation piece, and spaced apart from and arranged parallel to each other, such that the heat dissipation piece and the plurality of heat conduction plates together form a comb shape so as to define a plurality of accommodating spaces, wherein each of the plurality of the heat conduction plates has a free end away from the heat dissipation piece, and the free end has a through hole;
   a rod piece, wherein the rod piece has a first end and a second end opposite to each other, the rod piece penetrates through the through holes of the plurality of heat conduction plates, and the second end has a limitation portion; and
   a switch, having a cam portion which is pivoted to the first end of the rod piece;
   wherein when the switch is pivoted with respect to the plurality of heat conduction plates, the cam portion drives the rod piece to move among the through holes, making the limitation portion of the rod piece to press against or be separated from the plurality of heat conduction plates.

2. The heat dissipation device according to claim 1, further comprising at least one sleeve which is sleeved on the rod piece, wherein the at least one sleeve is located between two of the plurality of heat conduction plates which are adjacent to each other.

3. The heat dissipation device according to claim 1, further comprising a bottom frame, wherein the bottom frame has two first sides, a second side and a third side, the two first sides are spaced apart from each other, the second side and the third side are respectively connected to two opposite ends of the two first sides, the heat dissipation piece is connected to the second side, and the bottom frame is located under the plurality of heat conduction plates.

4. The heat dissipation device according to claim 3, wherein the heat dissipation piece has a plurality of insertion portions which extend toward the third side and are spaced apart from each other, each of the plurality of heat conduction plates has a plate body and a slot formed on the plate body, and one of the plurality heat conduction plates is fixed to one of the plurality of insertion portions through the slot thereof.

5. The heat dissipation device according to claim 1, wherein each of the plurality heat conduction plates has a plate body and at least one heat pipe embedded into the plate body.

6. The heat dissipation device according to claim 5, wherein each of the plurality of heat conduction plates further has a thermal pad connected to the plate body thereof.

7. A heat dissipation device, comprising:
   a heat dissipation piece;
   a plurality of heat conduction plates, the plurality of heat conduction plates connected to the heat dissipation piece and configured to define a plurality of accommodating spaces configured to accommodate a plurality of memory modules, and each of the plurality heat conduction plates having a through hole;
   a rod piece, wherein the rod piece has a first end and a second end, the rod piece penetrates through the through holes of the plurality of heat conduction plates, and the second end has a limitation portion; and
   a switch, having a cam portion which is pivoted to the rod piece, wherein the rod piece is movable among the through holes by being driven by the cam portion so as to make the limitation portion to presses against or be separated from the plurality of heat conduction plates.

8. The heat dissipation device according to claim 7, wherein the heat dissipation piece has a fluid channel therewithin.

9. The heat dissipation device according to claim 8, further comprising a flow tube connected to the fluid channel.

10. The heat dissipation device according to claim 7, further comprising a plurality of sleeves which are sleeved on the rod piece, wherein each of the plurality of the sleeves is located between two of the plurality of heat conduction plates that are adjacent to each other.

11. The heat dissipation device according to claim 7, wherein each of the plurality of heat conduction plates has a plate body and a heat pipe embedded into the plate body.

12. The heat dissipation device according to claim 11, wherein each of the plurality of heat conduction plates further has a thermal pad which is connected to the plate body and is configured to contact the memory modules.

* * * * *